United States Patent [19]

Mason et al.

[11] 4,207,149

[45] Jun. 10, 1980

[54] GOLD ELECTROPLATING SOLUTIONS AND PROCESSES

[75] Inventors: David R. Mason, Ross-on-Wye; Alan Blair, Upper Lydbrook; John S. Stevenson, Ruardean, all of England

[73] Assignee: Engelhard Minerals & Chemicals Corporation, Iselin, N.J.

[21] Appl. No.: 931,643

[22] Filed: Aug. 7, 1978

Related U.S. Application Data

[63] Continuation of Ser. No. 802,166, May 31, 1977, abandoned, which is a continuation of Ser. No. 636,441, Dec. 1, 1975, abandoned.

[30] Foreign Application Priority Data

Dec. 4, 1974 [GB] United Kingdom ............... 52520/74

[51] Int. Cl.$^2$ .............................................. C25D 3/48
[52] U.S. Cl. .................................... 204/46 G; 204/15
[58] Field of Search ................... 204/46 G, 43 G, 15

[56] References Cited

U.S. PATENT DOCUMENTS

| | | | |
|---|---|---|---|
| 2,812,299 | 11/1957 | Volk | 204/43 G |
| 2,967,135 | 1/1961 | Ostrow et al. | 204/43 G |
| 3,104,212 | 9/1963 | Rinker et al. | 204/46 G |
| 3,397,127 | 8/1968 | Camp | 204/46 G |
| 3,466,233 | 9/1969 | Greenspan | 204/46 G X |
| 3,617,452 | 11/1971 | Keith et al. | 204/46 G X |
| 3,833,487 | 9/1974 | Reinheimer | 204/46 G |
| 3,878,066 | 4/1975 | Dettke et al. | 204/43 G |
| 3,893,896 | 7/1975 | Korbelak | 204/44 |
| 3,898,137 | 8/1975 | Deuber | 204/43 G |
| 3,902,977 | 9/1975 | Greenspan | 204/43 G |

FOREIGN PATENT DOCUMENTS

| | | | |
|---|---|---|---|
| 1314288 | 11/1962 | France | 204/46 G |
| 928087 | 6/1963 | United Kingdom | 204/46 G |

OTHER PUBLICATIONS

E. D. Winters, Plating, pp. 213–218, Mar. 1972.
B. Sewell, Trans. Inst. Met. Finish, vol. 50, No. 3, pp. 121–124, (1972).

*Primary Examiner*—G. L. Kaplan

[57] ABSTRACT

Gold electroplating solutions, particularly useful for plating onto nickel-iron substrates, are prepared utilizing electrolytes of relatively low conductivity, such as boric acid, alkali metal and ammonium acetates, nitrates, sulfates and orthophosphates. The gold is plated onto substrates using a current density ranging from about 1 to about 2000 amperes/square foot at a temperature of about 20° to about 90° C.

15 Claims, No Drawings

GOLD ELECTROPLATING SOLUTIONS AND PROCESSES

This is a continuation of application Ser. No. 802,166 filed May 31, 1977, which in turn was a continuation of application Ser. No. 636,441 filed Dec. 1, 1975, both now abandoned.

BACKGROUND OF THE INVENTION

This invention relates to the production of semiconductor devices and is concerned with a gold electroplating solution for use in plating the nickel-iron substrates generally employed in such devices and with a method of electrodepositing gold on such substrates using the gold electroplating solution.

Semi-conductor devices normally comprise a germanium or silicon chip or slice supported by a substrate which, in the case of an integrated circuit flat pack, is generally termed a lead frame. Headers and lead frames are generally formed from nickel-iron alloys and are electrolytically gold plated to a thickness of about 2 microns so as to permit the bonding of the chip or slice to the substrate by formation of a gold-silicon or gold-germanium eutectic, since both silicon and germanium form low melting point alloys with gold. The gold-silicon eutectic has a melting point of 370° C. and contains approximately 3 percent silicon. The bonding operation, known as die-attachment or die-bonding, is normally completed in a few seconds at temperatures up to 500° C. However, the conventional test for gold deposits on nickel-iron substrates is a requirement to withstand a temperature of 500°-600° C. for five minutes in air without tarnishing or blistering of the gold deposit.

The gold deposit of 2 microns on the nickel-iron alloy serves the dual purpose of producing a pore-free film as well as supplying the gold for the resultant eutectic at the die-bonding stage. A porous gold deposit would allow the iron from the substrate to diffuse through to the surface forming an oxide which would discolor the component as well as inhibit the eutectic formation.

Lead frames can be selectively gold plated (i.e., plated only over desired areas), one of the main methods being by the use of a mechanical masking tool in conjunction with a high velocity jet of a gold electrolyte. However, it has hitherto been found that, due to the gold electrolytes presently used becoming contaminated, principally with iron and nickel, a marked deterioration in performance occurs progressively with increasing age of the electrolyte. The substrate nickel-iron dissolves chemically in the presently used gold electrolytes as a result of being attacked by the citrates, pyrophosphates and oxalates present in the electrolyte as chelating and buffering agents. The dissolution of nickel and iron into these electrolytes is related to contact time. As the majority of the semi-conductor devices are selectively gold plated using high current densitites of the order of 8 A/dm$^2$, the nickel-iron contaminant in the electrolyte affects the physical characteristics and structure of the gold deposit.

SUMMARY OF THE INVENTION

It is an object of the present invention to provide a gold electrolyte which will be suitable for use in high speed gold electroplating and in particular selective gold electroplating processes for nickel-iron substrates and will provide gold coatings which will meet the standard semi-conductor requirement referred to above, and which will be less prone to deterioration because of contamination than the electrolytes presently used for this purpose.

This and other objects will become apparent from the description and claims which follow.

It has been found that there is a relationship between the cell potential, the cathodic current density, and the nature of the deposited gold film. The present invention is concerned with the use of an electrolyte of relatively low conductivity compared to electrolytes hitherto used in previous gold electroplating and selective gold electroplating processes. Thus, utilizing the electroplating solutions of the present invention permits the cell voltage for a given current to be higher than that normally encountered in plating from prior art solutions. The potential may vary depending on the total current, the anode and cathode surface areas, electrolyte conductivity and operating temperature.

Electrolytes which exhibit the required characteristics can be formulated from a wide range of salts. However, certain compounds have been found to be particularly useful with respect to cost, effect on the gold deposit, the lack of harmful oxidation/reduction products generated during high current density electrolysis and the very low rate of chemical attack on nickel-iron substrates.

Thus, in accordance with one aspect of the invention, there is provided a gold electroplating solution comprising gold in the form of alkali metal gold cyanide, preferably KAu(CN)$_2$, and at least one conducting compound which may be selected from boric acid, and alkali metal (e.g. lithium, sodium or potassium) and ammonium acetates, borates, orthophosphates, tetraborates, nitrates, sulphamates, sulphates, tartrates, thiocyanates, thiosulphates, and metaborates.

In the case where a conducting compound which is not a good buffer is used, then at least one suitable buffer salt must also be incorporated in the electroplating solution.

DETAILED DESCRIPTION OF THE INVENTION

The conducting compound, which may, for example be sodium sulphate or potassium sulphate, may be present in the solution in an amount of from 1 to 200 g/l, advantageously 5 to 35 g/l, while the separate buffer salt, for example potassium dihydrogen orthophosphate or ammonium dihydrogen orthophosphate, may be present in an amount of from 1 to 200 g/l, advantageously 5 to 35 g/l. The gold will normally be present in an amount of from 1 to 100 g/l, preferably 5 to 12 g/l.

The gold electroplating solution of the invention will normally have a pH in the range of from 4 to 8, preferably 6 to 7, and a density which is generally lower than that of conventional gold plating solutions (8° to 20° Be), i.e., 2.0° to 12° Be.

In accordance with another aspect of the invention, there is provided a method of electrodepositing gold on to a nickel-iron substrate for a semi-conductor device, which method comprises electroplating said substrate with a gold electroplating solution as defined above at a current density of from 1 to 2000 preferably 100 to 1000, amperes per square foot (A/ft$^2$) and a temperature in the range of from 20° to 90° C., preferably 50° to 75° C., with vigorous agitation, such as by vigorous cathode movement or by spraying the solution on to the cathode.

The gold electroplating solution of the invention can be prepared by dissolving the constituents in water and used in accordance with the techniques well known in the art.

The following Examples illustrate the invention.

EXAMPLE 1

A gold electroplating solution was made up from the following constituents:

| | |
|---|---|
| Gold (as potassium gold cyanide) | 8 g/l |
| Potassium dihydrogen orthophosphate | 10 g/l |
| Sodium sulphate | 10 g/l |

The pH of the solution was 6.5 and the operating temperature 60° C. When plated under high speed jet spraying conditions, the electroplating solution produced coherent smooth gold deposits at cathode current densities between 80–150 A/ft$^2$. Cathode efficiencies of 80–90% were obtained provided the velocity of the solution over the cathode area was sufficient to prevent excessive polarization. When plated at a thickness of 2 microns of gold on nickel-iron alloy, the deposit withstood heating to 500° C. for 5 minutes in air without significant discloration.

EXAMPLE 2

A gold electroplating solution was made up from the following constituents:

| | |
|---|---|
| Potassium nitrate | 20 g/l |
| Potassium dihydrogen orthophosphate | 5.5 g/l |
| Boric Acid | 30 g/l |
| Gold (as potassium gold cyanide) | 8 g/l |

The solution was plated on to a nickel-iron alloy using jet spraying equipment at a pH of 6.5 and a temperature of 65° C. The gold deposit was smooth and coherent and at thickness of 2–4 microns did not discolour significantly during the 500° C. heat test.

EXAMPLE 3

A gold electroplating solution was made up by dissolving the following constituents in water:

| | |
|---|---|
| Gold (as potassium gold cyanide) | 8 g/l |
| Dipotassium hydrogen orthophosphate | 10 g/l |

The pH was adjusted to 6.5 with dilute phosphoric acid and the solution operated at 70° C. The results obtained at current densities of 80–140 A/ft$^2$ were similar to those obtained in Examples 1 and 2.

EXAMPLES 4

A gold electroplating solution was made up by dissolving the following constituents in water:

| | |
|---|---|
| Gold (as potassium gold cyanide) | 8 g/l |
| Boric acid | 10 g/l |

The pH was adjusted to 6.5 with KOH solution and the solution operated at 60° C. Results similar to those of Example 3 were obtained. The gold deposited at current densities of 60–100 A/ft$^2$ was lustrous and did not tarnish significantly after 5 minutes at 500° C. on nickel-iron alloy.

EXAMPLES 5–15

Additional gold electroplating solutions were made up in accordance with this invention and plated onto a nickel-iron alloy using jet spraying equipment. The components of the solutions prepared, the temperature and pH of the solution when plating, and the cathode current density are given in Table I. In all cases, the gold was present as potassium gold cyanide and the electroplating solutions were made up by dissolving the constituents in water.

Deposits ranging from 50–100 micro inches were obtained and all were tarnish-free after heating to 500° C. for 5 minutes in air. All deposits die-bonded satisfactorily.

TABLE I

| Example | Solution Constituents | Concentration g/l | Solution pH | Temp. (°C.) | Cathode Current Density (A/ft$^2$) | REMARKS |
|---|---|---|---|---|---|---|
| 5 | Gold | 8 | 6.0 | 40 | 100 | Smooth coherent coating |
|   | Sodium Sulfate | 5 | | | | |
| 6 | Gold | 8 | 6.5 | 50 | 125 | Smooth coherent coating |
|   | Dipotassium Hydrogen Orthophosphate | 5 | | | | |
| 7 | Gold | 8 | 6.5 | 50 | 175 | |
|   | Potassium Acetate | 30 | | | | |
| 8 | Gold | 8 | 6.5 | 65 | 300 | Smooth coherent coating |
|   | Potassium Sulfate | 10 | | | | |
|   | Dipotassium Hydrogen Orthophosphate | 5 | | | | |
| 9 | Gold | 8 | 6.5 | 50 | 175 | |
|   | Potassium Tartrate | 30 | | | | |
| 10 | Gold | 8 | 6.5 | 60 | 350 | Smooth coherent coating |
|   | Potassium Sulfate | 50 | | | | |
|   | Dipotassium Hydrogen Orthophosphate | 5 | | | | |
| 11 | Gold | 6 | 6.5 | 50 | 175 | |
|   | Potassium Thiosulfate | 20 | | | | |
|   | Potassium Tetraborate | 10 | | | | |
| 12 | Gold | 10 | 6.5 | 50 | 175 | |
|   | Potassium Thiocyanate | 20 | | | | |
|   | Potassium Borate | 10 | | | | |
| 13 | Gold | 5 | 6.5 | 55 | 200 | Smooth coherent coating |
|   | Sodium | 20 | | | | |
|   | Boric Acid | 30 | | | | |

TABLE I-continued

| Example | Solution Constituents | Concentration g/l | Solution pH | Temp. (°C.) | Cathode Current Density (A/ft$^2$) | REMARKS |
|---|---|---|---|---|---|---|
| 14 | Dipotassium Hydrogen Orthophosphate | 5.5 | | | | |
|  | Gold | 5 | 6.5 | 50 | 180 | Smooth coherent coating |
|  | Potassium Nitrate | 20 | | | | |
|  | Boric Acid | 30 | | | | |
| 15 | Gold | 6 | 6.5 | 50 | 250 | Smooth coherent coating |
|  | Potassium Nitrate | 20 | | | | |
|  | Dipotassium Hydrogen Orthophosphate | 5 | | | | |

EXAMPLE 16

An electroplating solution was prepared by dissolving the following constituents in water:

| | |
|---|---|
| Gold (as Potassium Gold Cyanide) | 22 g/l |
| Potassium Nitrate | 25 g/l |
| Potassium Dihydrogen Phosphate | 6.5 g/l |
| Boric acid | 30 g/l |

The solution was plated onto a nickel-iron alloy using jet spraying equipment at a pH of about 5.5 and a temperature of about 55° C.–65° C. The cathode current density was 1000 A/ft$^2$.

While the present invention has been described with respect to certain preferred embodiments and operating conditions, they are intended to be merely illustrative of the wide variety of solutions and processes embraced by the invention as defined in the appended claims.

What is claimed is:

1. An aqueous gold electroplating solution consisting of,
   about 1 to about 100 g/liter of gold in the form of a gold compound;
   about 1 to about 200 g/liter of a conducting material selected from the group consisting of boric acid, alkali metal borate, alkali metal orthoborate, alkali metal tetraborate, alkali metal metaborate, alkali metal thiocyanate, alkali metal thiosulfate, ammonium metaborate, ammonium tetraborate, ammonium perborate, ammonium thiocyanate and ammonium thiosulfate; the concentration of said conducting material and water in said solution being commensurate with a pH of about 4 to about 8 and a viscosity of from about 2° to about 12° Be.

2. A solution according to claim 1 wherein said gold compound is an alkali metal gold cyanide.

3. A solution according to claim 2 wherein said alkali metal is potassium.

4. A method for minimizing discoloration of gold electrolytically applied by plating onto an iron-containing substrate susceptible to chemical attack by effecting the electroplating step in the presence of an electroplating solution consisting of,
   (a) about 1 to about 100 g/liter of gold in the form of a gold compound;
   (b) about 1 to about 200 g/liter of a conducting material selected from the group consisting of boric acid, an alkali metal borate, alkali metal orthoborate, alkali metal tetraborate, alkali metal metaborate, alkali metal thiocyanate, alkali metal thiosulfate, ammonium metaborate, ammonium tetraborate, ammonium perborate, ammonium thiocyanate and ammonium thiosulfate; the concentration of conducting material and water in said solution being commensurate with a pH range of about 4 to about 8 and a viscosity of from about 2° to about 12° Be.

5. A method according to claim 4 wherein said electroplating is conducted at a temperature in the range of from about 20° to about 90° C.

6. A method according to claim 4 wherein the current density is in the range of from about 100 to about 1000 amperes per square foot.

7. A method according to claim 6 wherein said gold compound is an alkali metal gold cyanide.

8. A method according to claim 7 wherein said alkali metal is potassium.

9. An aqueous gold electroplating solution comprising, in combination, about 1 to about 100 g/liter of gold in the form of a gold compound and
   about 1 to 200 g/liter of a conducting material selected from the group consisting of boric acid, an alkali metal nitrate and an alkali metal orthophosphate, provided that there is present at least an alkali metal nitrate and an alkali metal orthophosphate, the concentration of conducting material and water in said solution being commensurate with a pH of about 4 to about 8 and a viscosity of from about 2° to about 12° Be.

10. A solution according to claim 9 consisting of water, potassium gold cyanide, potassium nitrate and dipotassium hydrogen orthophosphate.

11. A method for minimizing discoloration of gold electrolytically applied by plating onto an iron-containing substrate susceptible to chemical attack by effecting the electroplating step in the presence of an electroplating solution comprising, in combination,
   about 1 to about 100 g/liter of gold in the form of a gold compound and
   about 1 to about 200 g/liter of a conducting material selected from the group consisting of boric acid, an alkali metal nitrate and an alkali metal orthophosphate, provided that there is present at least an alkali metal nitrate and an alkali metal orthophosphate; the concentration of conducting material and water in said solution being commensurate with a pH range of about 4 to about 8 and a viscosity of from about 2° to about 12° Be.

12. A method according to claim 11 wherein the current density is in the range of from about 100 to about 1000 Amperes per square foot.

13. A method according to claim 12 wherein said gold compound is an alkali metal gold cyanide.

14. A method according to claim 12 wherein said alakli metal is potassium.

15. A method according to claim 14 wherein said solution consists of water, potassium gold cyanide, potassium nitrate and dipotassium hydrogen orthophosphate.

* * * * *